(12) United States Patent
Iida (10) Patent No.: US 7,749,865 B2
(45) Date of Patent: Jul. 6, 2010

(54) METHOD FOR PRODUCING SEMICONDUCTOR WAFERS AND A SYSTEM FOR DETERMINING A CUT POSITION IN A SEMICONDUCTOR INGOT

(75) Inventor: Makoto Iida, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 826 days.

(21) Appl. No.: 10/586,476

(22) PCT Filed: Jan. 20, 2005

(86) PCT No.: PCT/JP2005/000641

§ 371 (c)(1),
(2), (4) Date: Jul. 18, 2006

(87) PCT Pub. No.: WO2005/076333

PCT Pub. Date: Aug. 18, 2005

(65) Prior Publication Data

US 2007/0243695 A1   Oct. 18, 2007

(30) Foreign Application Priority Data

Feb. 3, 2004   (JP)   ............................. 2004-026887

(51) Int. Cl.
H01L 21/00 (2006.01)
C30B 21/04 (2006.01)
C30B 15/26 (2006.01)

(52) U.S. Cl. .................... 438/460; 117/38; 117/201

(58) Field of Classification Search ................. 438/460; 117/38, 201

See application file for complete search history.

(56) References Cited

U.S. PATENT DOCUMENTS

| 2,968,866 | A | * | 1/1961 | Soper et al. .................. 438/465 |
| 4,344,815 | A | * | 8/1982 | Cazarra et al. ................ 438/10 |
| 5,550,374 | A | * | 8/1996 | Holzer et al. .......... 250/339.07 |
| 6,045,610 | A | * | 4/2000 | Park et al. ...................... 117/13 |
| 6,713,370 | B2 | * | 3/2004 | Falster ......................... 438/471 |
| 6,849,119 | B2 | * | 2/2005 | Falster et al. .................... 117/2 |
| 7,335,256 | B2 | * | 2/2008 | Weber et al. .................. 117/30 |
| 2002/0009862 | A1 | * | 1/2002 | Mun .......................... 438/471 |
| 2003/0079674 | A1 | * | 5/2003 | Tachikawa et al. ............ 117/30 |

(Continued)

FOREIGN PATENT DOCUMENTS

JP   A-11-278983   10/1999

(Continued)

*Primary Examiner*—G. Nagesh Rao
(74) *Attorney, Agent, or Firm*—Oliff & Berridge, PLC (57) ABSTRACT

A method for producing semiconductor wafers, from a semiconductor ingot, wherein an oxygen concentration distribution in the growth axis direction is measured in the ingot state (F2), a position at which the oxygen concentration is maximum or minimum in a range of a predetermined length is determined as a cut position according to the measurement results (F3), the ingot is cut in a perpendicular direction to the growth axis at the cut position into blocks each having the oxygen concentrations being maximum and minimum at both ends thereof (F4), each of the blocks is sliced, and thereby semiconductor wafers are produced. Thereby, there can be provided a technique by which when semiconductor wafers are produced from a semiconductor ingot, wafers having oxygen concentration being in a predetermined standard range can be certainly produced.

18 Claims, 3 Drawing Sheets

U.S. PATENT DOCUMENTS

2003/0196586 A1* 10/2003 Falster et al. .................... 117/2
2004/0009111 A1* 1/2004 Haga et al. ............... 423/328.2
2007/0113778 A1* 5/2007 Komiya et al. ................. 117/54
2007/0224783 A1* 9/2007 Falster et al. ................ 438/471
2007/0243695 A1* 10/2007 Iida ........................... 438/460

FOREIGN PATENT DOCUMENTS

JP      A-2002-174593      6/2002

* cited by examiner

METHOD FOR PRODUCING SEMICONDUCTOR WAFERS AND A SYSTEM FOR DETERMINING A CUT POSITION IN A SEMICONDUCTOR INGOT

CROSS-RELATED APPLICATIONS

Application Ser. No. 10/586,476 is a national stage entry of PCT/JP05/00641.

TECHNICAL FIELD

The present invention relates to a technique for producing semiconductor wafers by cutting a semiconductor ingot, and particularly relates to a method for producing semiconductor wafers for obtaining certainly semiconductor wafers having predetermined oxygen concentration, and a system for determining a cut position in a semiconductor ingot.

BACKGROUND ART

Conventionally, in the case of producing silicon wafers from a silicon single crystal ingot, for example, a single crystal ingot grown by Czochralski method (CZ method) is cylindrically ground to be finished to have a predetermined size (diameter), and its top and tale which are unusable as products are cut off. Then, the ingot is cut at a predetermined position and to be blocks having lengths for being possible to be put in a slicing apparatus such as an inner diameter blade or a wire saw. In this case, samples for quality inspection such as for oxygen concentration are sliced at the same time. Next, silicon wafers can be obtained by slicing each of the blocks by a predetermined thickness.

As a method for producing a semiconductor ingot such as a silicon single crystal, Floating Zone method (FZ method) and so forth are known as well as CZ method. However, in recent years, diameter of semiconductor wafers has enlarged, for example, CZ method is used in the case of growing a silicon single crystal ingot having a diameter measured up to 300 mm or more.

In the case of growing a silicon single crystal ingot by CZ method, a quartz crucible is used as a container containing a silicon melt to be a raw material. However, in the growth, oxygen solves in the melt from a quartz crucible and oxygen is taken in the grown ingot. In addition, in the case of obtaining a single crystal having low oxygen concentration, MCZ method in which a raw material melt is applied with magnetic field and thereby convection is suppressed is occasionally adopted.

Oxygen concentration in the single crystal is controlled by adjusting rotation rate of the crucible, pulling rate, temperature gradient, and so forth. However, it is inevitable that an extent of dispersion is caused inside the same crystal. However, oxygen concentration in the crystal has an effect on gettering capability and such after the crystal is processed into wafers, and has an effect on yield in the device process. Therefore, oxygen concentration in the wafer is required to be in a predetermined standard range and it is required to evaluate oxygen concentration of the grown ingot.

Conventionally, as a method for evaluating quality of a grown silicon single crystal ingot, there is a method for evaluating parts of both ends of each of the blocks after an ingot is cut into blocks having a predetermined length.

For example, when an ingot is cut into blocks, a cut position in the ingot is made to be a discretionary position or a position determined according to information such as pulling rate. And, after the cutting, slab samples for measuring quality are obtained from both ends of each of the blocks, and admission decision of the block is performed by evaluating resistivity or oxygen concentration of the slab samples.

According to such a method, resistivity inside the block can be very accurately estimated by calculation from segregation coefficient and such. However, oxygen concentration inside the block is often higher or lower than oxygen concentration at an end face of the block. In particular, if a single crystal is grown according to MCZ method, oxygen concentration is occasionally changed unexpectedly according to distribution of the magnetic field or the like.

Therefore, in the case that standard of oxygen concentration is tight, in such a crystal as having a peak of oxygen concentration in the block, even when oxygen concentration at end faces of the block is admitted, oxygen concentration in the block does not always satisfy the standard. In particular, a wafer obtained by slicing a block in which oxygen concentrations at the end faces are admitted narrowly to the standard has possibility of causing a problem at a device process due to oxygen concentration fault.

Moreover, in such a method for evaluating oxygen concentration only at end faces of blocks as described above, a local shift in oxygen concentration is frequently overlooked. Although there is a problem in the single crystal production recipe, it cannot be occasionally recognized. Therefore, there is also a problem that it is difficult to improve the single crystal production recipe.

As a method for improving such problems, there has been suggested a method for measuring an oxygen concentration distribution in the longitudinal direction (growth axis direction) of an ingot according to an infrared absorption spectrometer or the like and then cutting only parts fitting in a predetermined oxygen concentration as blocks for slicing (Japanese Patent Application Laid-open (kokai) No. 2002-174593). Specifically, after a single crystal ingot is cylindrically ground, infrared is irradiated from a radial direction and oxygen concentration is measured from the absorption. Such measurement is performed by predetermined intervals along the longitudinal direction of the ingot and thereby an oxygen concentration distribution in the longitudinal direction can be measured.

However, oxygen concentration in a horizontal direction (radial direction) to be measured in the ingot state as described above is average in the part, and therefore, for example, in the case that there is difference in oxygen concentration between the center and the periphery in the ingot, even when the measurement value satisfies with a standard, oxygen concentration in the center or the periphery does not actually satisfy the standard, occasionally. That is, in such a method as described above, it is feared that a block that does not satisfy the standard of oxygen concentration in the center or the periphery thereof is determined as acceptance.

Accordingly, there are problems that if a block determined as acceptance is processed into wafers, it is highly possible to put in a device process a wafer that does not actually satisfy a standard of oxygen concentration, and reliability is not sufficient.

DISCLOSURE OF THE INVENTION

Accordingly, the present invention was conceived in view of the above problems. An object of the present invention is to provide a technique by which when semiconductor wafers are produced from a semiconductor ingot having a diameter of 150 mm or more, wafers having oxygen concentration being in a predetermined standard range can be certainly produced.

According to the present invention, there is provided a method for producing semiconductor wafers from a semiconductor ingot, wherein an oxygen concentration distribution in the growth axis direction is measured in the ingot state, a position at which the oxygen concentration is maximum or minimum in a range of a predetermined length is determined as a cut position according to the measurement results, the ingot is cut in a perpendicular direction to the growth axis at the cut position into blocks each having the oxygen concentrations being maximum and minimum at both ends thereof, each of the blocks is sliced, and thereby semiconductor wafers are produced.

If an ingot is cut into blocks each having the oxygen concentrations being maximum and minimum at both ends thereof according to an oxygen concentration distribution in the growth axis direction that is measured in the ingot state as described above, oxygen concentration in the block is between the maximum and the minimum. Therefore, if the oxygen concentrations at both ends of the block (the maximum and the minimum) are in a standard range, wafers having oxygen concentration in a standard range can be certainly produced by slicing to process the block into wafers.

In this case, it is possible that in the determination of a cut position, the semiconductor ingot is divided into blocks within a range of a preliminarily set length, a position to be cut is adjusted so that the oxygen concentrations at both ends of each of the blocks are maximum and minimum, and when it is confirmed that the oxygen concentrations at both ends of each of all the blocks are maximum and minimum, the position is determined as the cut position.

If a position to be cut is adjusted so that the oxygen concentrations at preliminarily set both ends of each of the blocks are maximum and minimum and the position is determined as the cut position when it is confirmed that the oxygen concentrations at both ends of each of all the blocks are maximum and minimum, each of the blocks can be cut easily and certainly so that the oxygen concentrations at both ends thereof are maximum and minimum.

Moreover, in the determination of a cut position, the cut position can be also determined so that the oxygen concentrations are in a standard range and maximum and minimum at both ends of each of the blocks.

That is, in the case that there is a part being out of a standard range in the oxygen concentration distribution of the ingot, if the cut position is also determined so that the oxygen concentrations are in a standard range and maximum and minimum at both ends of each of the blocks, it can be avoided that a part out of a standard range is mixed in the block.

Moreover, it is preferable that samples are sliced from both ends of each of the blocks obtained by cutting the semiconductor ingot, oxygen concentration in a plane of each of the samples is measured, and if the oxygen concentration in a plane is in a standard range, the block is sliced, and thereby semiconductor wafers are produced, and on the other hand if the oxygen concentration in a plane is out of a standard range, another sample is further sliced from the end of the block and oxygen concentration in its plane is measured repeatedly, and then if the oxygen concentration in its plane becomes in the standard range, the block is sliced, and thereby semiconductor wafers are produced.

The oxygen concentration inside the block is between the oxygen concentrations at the both ends. Therefore if the oxygen concentration in a plane with respect to samples sliced from both ends of each of the blocks is measured and confirmed to be in a standard range and therefore sliced, wafers having the oxygen concentration in the standard range can be more certainly produced. Moreover, because things out of the standard can be excluded at the block stage, sequential steps such as slicing are not to become wasted.

Moreover, in the case of finding that the oxygen concentration of each of the samples sliced from the both ends has a part out of the standard range, the position thereof can be grasped accurately. Therefore, by giving feedback to next production of a semiconductor ingot, the production recipe for an ingot can be improved effectively.

As the semiconductor ingot, a silicon single crystal ingot having a diameter 150 mm or more can be used.

A silicon single crystal has been generalized as semiconductor wafers for devices. A silicon single crystal ingot is frequently produced according to CZ method and it is important to evaluate the oxygen concentration in the crystal. On the other hand, because oxygen concentration standard becomes tighter as diameter of the silicon single crystal ingot become larger, it tends to be more difficult to control the oxygen concentration in the axis direction and in the radial direction. Accordingly, it is particularly effective that the present invention is applied in production of semiconductor wafers having a diameter of 150 mm or more, more preferably, a diameter of 200 mm or more because a silicon wafer having oxygen concentration in a standard range can be produced certainly and effectively and therefore to lead to improvement of device production yield and reduction of production cost.

Furthermore, there is provided a system for determining a cut position when a semiconductor ingot is cut into blocks, at least, comprising a means for measuring an oxygen concentration distribution in the growth axis direction with respect to the ingot, a means for taking the measured oxygen concentration distribution data in a database, a means for determining a cut position so that the oxygen concentrations at both ends of a block to be obtained by the cutting are maximum and minimum, and a means for transmitting information about the determined cut position to an ingot cutting apparatus.

By such a system for determining a cut position in a semiconductor ingot, according to the oxygen concentration in the growth axis direction of the ingot, a cut position at which the oxygen concentrations at both ends of each of the blocks are maximum and minimum can be automatically transmitted to an ingot cutting apparatus, and therefore workers' burden can be saved, the semiconductor ingot can be cut at the cut position. And, the oxygen concentrations in the blocks cut as described above are maximum and minimum at the both ends. Therefore, if these values satisfy a standard value, oxygen fault wafers can be certainly prevented from being put in a device process and the sequential steps are not to become wasted.

Furthermore, because an oxygen concentration distribution in the growth axis direction can grasped accurately and easily, information for improving the single crystal production recipe to be proper can be also obtained.

In this case, the means for determining a cut position can include a means for dividing the semiconductor ingot into blocks in a range of a preliminarily set length, a means for adjusting a position to be cut so that the oxygen concentrations at both ends of each of the blocks are maximum and minimum, and a means for confirming that oxygen concentrations at both ends of the blocks are maximum and minimum.

By such a means for determining a cut position, the cut position can be more promptly and more accurately determined mainly by adjustment of the position to be cut and confirmation of the oxygen concentration, so that the cut position having a predetermined length and oxygen concentrations being maximum and minimum at the both end faces can be determined in a short time and certainly.

According to the present invention, when a semiconductor ingot is cut into blocks, the ingot is cut so that the oxygen concentrations at both ends of each of the blocks are maximum and minimum in the block, and therefore the oxygen concentration of wafers which are sliced from the block is in the range between the values at the both ends. Therefore, if the oxygen concentrations at the both ends are in the standard range, wafers having the oxygen concentration being in a predetermined standard range can be certainly produced by slicing the block, and wafers of oxygen concentration fault are certainly prevented from being put in a device process. In particular, it is extremely effective that the present invention is applied to a single crystal grown according to MCZ method in which oxygen concentration is occasionally changed unexpectedly depending on distribution of magnetic field.

Moreover, quality assurance for the oxygen concentration inside the block by oxygen concentrations at the both ends of the block can be certainly performed, and therefore it becomes extremely advantageous in quality assurance.

Furthermore, because steps after slicing are not to become wasted and additionally the production recipe for semiconductor ingots can be also improved effectively and properly, it also leads to improvement of yield in production of wafers from a semiconductor ingot.

BEST MODE FOR CARRYING OUT THE INVENTION

Hereinafter, as an appropriate embodiment of the present invention, the case of producing silicon single crystal wafers from a silicon single crystal ingot is specifically explained with reference to appended drawings.

Figure 1:
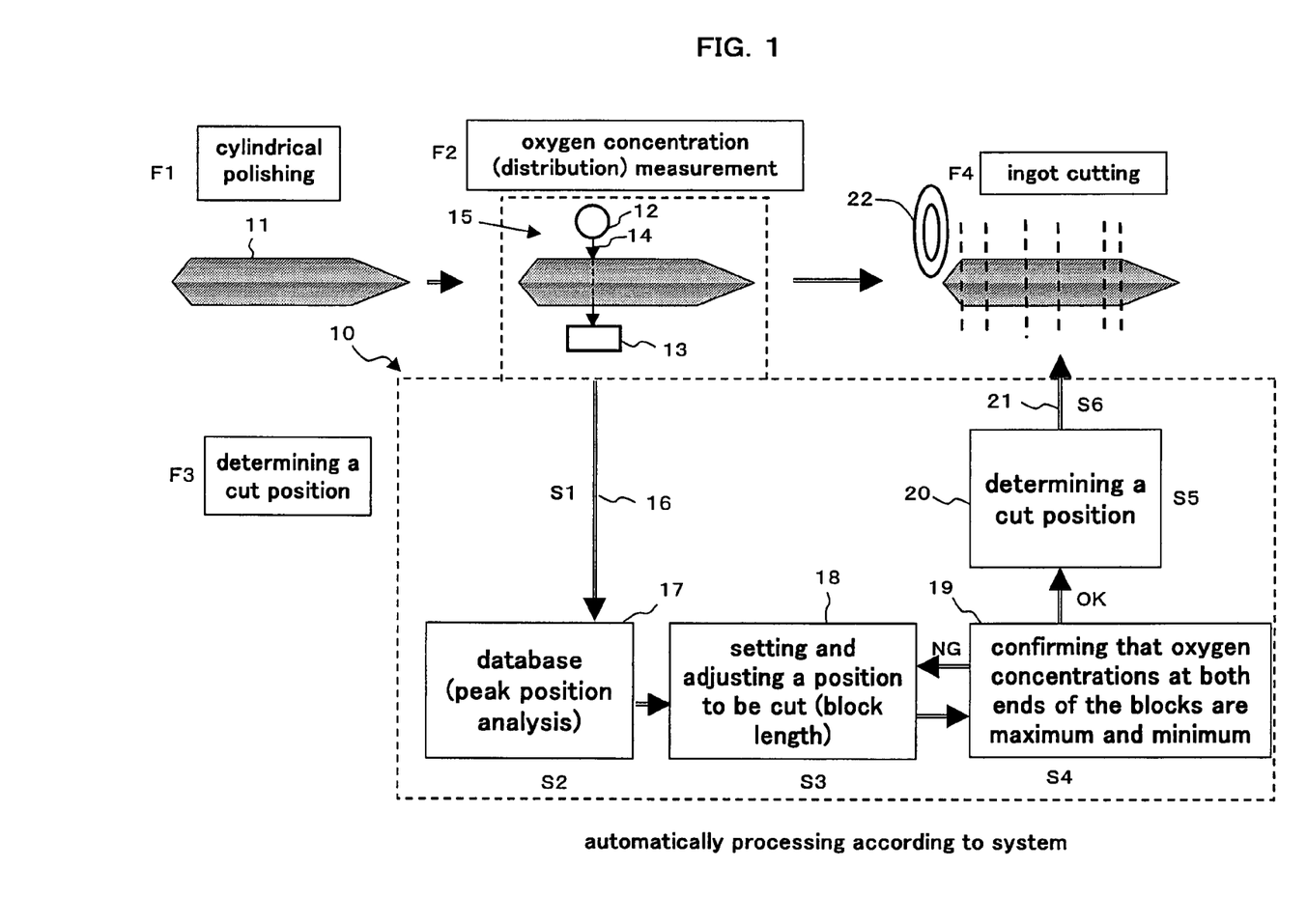
FIG. 1 is a schematic constitution view showing an example of a system for determining a cut position in a semiconductor ingot according to the present invention.

FIG. 1 is a view showing schematically a constitution of an example of a system for determining a cut position in a semiconductor ingot according to the present invention and a flow (F1-F4) to the cutting of the ingot.

This system 10 for determining a cut position, mainly comprises a means 15 for measuring an oxygen concentration distribution in the growth axis direction with respect to a silicon single crystal ingot 11, a means 16, 17 for taking the measured oxygen concentration distribution data in a database, a means 18-20 for determining a cut position so that the oxygen concentrations at both ends of a block to be obtained by the cutting are maximum and minimum, and a means 21 for transmitting information about the determined cut position to an ingot cutting apparatus 22.

The means 15 for measuring an oxygen concentration distribution is not particularly limited as long as an oxygen concentration distribution in the growth axis direction can be measured in the ingot state. However, an infrared absorption spectrometer (IR) or a Fourier transform infrared spectrometer (FTIR) can be suitably used. In particular, as an apparatus for measuring automatically oxygen concentration, for example, a QS-FRS system (manufactured by Accent. Co., Ltd.) has been marketed. By this apparatus, infrared 14 is irradiated from a horizontal direction (radial direction) of the single crystal ingot 11 and an average oxygen concentration in the radial direction of the single crystal ingot 11 can be automatically measured from the absorption.

On the other hand, the means 18-20 for determining a cut position, comprises a means 18 for dividing a silicon single crystal ingot into blocks in a range of a preliminarily set length and adjusting a position to be cut so that the oxygen concentrations at both ends of each of the blocks are maximum and minimum, and a means 19 for confirming that oxygen concentrations at both ends of the blocks are maximum and minimum.

In addition, the means 16, 17 for taking in data, the means 18-20 for determining a cut position, and the transmission means 21, can be constituted by at least one electronic computer and program, for example.

A method for producing silicon wafers from the silicon single crystal ingot 11 using such a system 10 for determining a cut position as described above will be explained specifically.

First, a silicon single crystal ingot 11 to be processed into wafers is prepared and cylindrically ground or cylindrically polished to have a predetermined diameter (F1). By grinding cylindrically (polishing cylindrically) an ingot, surface scattering can be suppressed and measurement of oxygen concentration by infrared becomes easy. In addition, it is sufficient that grain size in the cylindrical grinding is 70 or more because the measurement can be performed sufficiently on a surface condition by a normal cylindrical grinding.

Next, by a means 15 for measuring an oxygen concentration distribution, an oxygen concentration distribution in the growth axis direction is measured in the ingot state. The measurement means 15 has an infrared source 12 and an infrared detector 13, infrared 14 is irradiated from a radial direction of the silicon single crystal ingot 11 and oxygen concentration in the radial direction of the ingot 11 is measured from the absorption. And, by scanning the infrared source 12 and so forth along the growth axis direction, an oxygen concentration distribution in the growth axis direction in the single crystal ingot can be measured in the ingot state (F2).

In this case, in the oxygen concentration measurement according to infrared absorption by the infrared detector 13, a peak originated out of Si—O binding of an interstitial oxygen and a silicon being 1107 cm$^{-1}$ which has been conventionally used is not used but a peak originated out of Si—O binding of an interstitial oxygen and a silicon being 1720 cm$^{-1}$ is used.

This is because surface scattering or an interference peak is caused if the peak of 1107 cm$^{-1}$ is attempted to detect in the ingot state and on the other hand there is no interference peak near the peak of 1720 cm$^{-1}$ and therefore it can be appropriately detected in the ingot state.

Moreover, in the present invention, the measurement can be performed by a discretionary interval in the longitudinal direction of an ingot. However, it is preferable to perform the measurement by an interval of 5-20 mm. If the measurement is performed by an interval of less than 5 mm, the measurement time becomes longer. On the other hand, if the measurement is performed by the interval of more than 20 mm, accuracy of the oxygen concentration distribution in the growth axis direction is degraded and it is feared to become impossible to determine accurately peak positions of oxygen concentration (maximum and minimum) in a predetermined range.

In the measurement of oxygen concentration, it is preferable that the oxygen concentration is measured in as long state of the ingot as possible because degree of freedom of the sequential ingot cutting process becomes larger, and the measurement can be performed before the top and tail of the ingot after being grown are cut off. However, in the case that it is limited by peripheral devices or installation place of the apparatus for measuring oxygen concentration, the oxygen concentration may be measured after the ingot is cut by an appropriate length.

After an oxygen concentration distribution in the growth axis direction is measured, a position at which the oxygen concentration is maximum or minimum in a range of a predetermined length is determined as a cut position according to the measurement results.

First, data of the oxygen concentration distribution measured by the infrared detector 13 is automatically taken in a database 17 of a system 10 for determining a cut position in an ingot according to a means 16 for taking in data (S1).

And, a position (peak position) so that oxygen concentration corresponds to maximum or minimum is automatically analyzed (S2), and the ingot is divided into blocks in a range of a preliminarily set length (S3). In this case, the block length to be set is made to be a length for being possible to be put in a slicing apparatus. If the length of the ingot is too short, a problem for fastening it to a slicing apparatus is caused, and conversely, if the length is longer than the apparatus capacity, the slicing is impossible. However, if the blocks are set to be too small, operation time becomes long in the sequential cutting step and slicing step, and additionally, it is feared to degrade yield, and therefore, it is preferable that the length of each of the blocks is set to be in the range of 5-50 cm, particularly in the range of 10-40 cm.

Next, it is confirmed whether the oxygen concentrations at the both ends of each of the blocks, which are preliminarily set as described above, become maximum and minimum (S4). And, if the oxygen concentrations at both ends of the block are not maximum and minimum, the position to be cut is adjusted (S3). In this case, the adjustment of the position to be cut is performed so that the oxygen concentrations at the both ends of each of the blocks are maximum and minimum and also the length of each of the blocks becomes a length for being possible to be put in a slicing apparatus.

And, when it is confirmed that each of all the blocks have the predetermined length and that the oxygen concentrations at both ends thereof are maximum and minimum, the position is determined as the cut position (S5) and information about the determined cut position is transmitted to an ingot cutting apparatus 22 (S6).

Such successive operations from the measurement of oxygen concentration of an ingot to the determination of a cut position as described above are possible to be automatically performed according to a system 10 for determining a cut position in a semiconductor ingot in accordance with the present invention, and therefore finished in a short time and do not lay a burden on workers.

Next, at the cut position determined as described above, the silicon single crystal ingot 11 is cut in the perpendicular direction to the growth axis (F4).

In this case, for the cutting of the ingot 11, a cutting apparatus 22 such as a band saw, an inner diameter blade, or an outer diameter blade, can be used appropriately. By cutting the ingot after a cut position is determined as described above, it becomes cut into blocks each having the oxygen concentrations being maximum and minimum at both ends thereof.

In addition, with respect to a part having oxygen concentration being obviously out of a standard range, for example, a part over a standard value may be cut and removed as a block containing only the part out of the standard. For example, if there is a part out of a standard range when an oxygen concentration distribution of the ingot is measured, when a cut position is determined, the cut position is determined so that the oxygen concentrations are in the standard range and maximum and minimum at both ends of each of the blocks, and the other part being out of the standard range may be removed. In particular, even when oxygen concentration is unexpectedly changed in the single crystal grown according to MCZ method, if a cut position is determined so that a part being out of the standard range as described above is preliminarily removed, a block or a wafer being out of the standard can be certainly prevented from mixing.

Each of the blocks cut as described above have the oxygen concentrations being maximum and minimum at both ends thereof. Therefore, if both of the maximum and the minimum are in the standard range, the oxygen concentration between them in the block can be determined to be in the standard range. Therefore, by putting such a block in a slicing apparatus such as an inner diameter blade or a wire saw and slicing the block, wafers having oxygen concentration in the standard range can be certainly produced.

However, the oxygen concentration measured actually with respect to the ingot is average in each of planes in a radial direction, namely in the case of processing it into wafers. Oxygen concentrations at respective parts in the plane have some difference. Generally, an oxygen concentration at the center of an ingot (in the wafer plane) is higher than the measurement value according to a measurement apparatus 15 and oxygen concentration at the periphery thereof indicates a lower value than the measurement value according to a measurement apparatus 15.

Accordingly, in order to confirm that the oxygen concentration is certainly in the standard range in the entire block, it is preferable that before the slicing, slab samples for measuring crystal quality are sliced from the both ends of the block and oxygen concentration in a plane of each of the samples is measured. For example, with respect to the slab samples, the oxygen concentration in a plane is measured according to FTIR and then admission decision is performed. In the present invention, oxygen concentrations at both ends of each of the blocks obtained by cutting an ingot are maximum and minimum. Therefore, the oxygen concentration in the block is in the range between the oxygen concentrations at the both ends. Therefore, oxygen concentration in a plane of each of the slab samples sliced from the both ends of each of the blocks is measured, and if the oxygen concentration is in a standard range over the entire plane, oxygen concentration in the block, namely, oxygen concentration in the silicon wafer obtained by slicing the blocks is certainly in the standard range. Therefore, such an unnecessary step as slicing a thing being out of the oxygen standard can be avoided.

On the other hand, samples are sliced from the both ends of each of the blocks, and when oxygen concentration in a plane of each of the samples is measured, if the oxygen concentration in a plane is out of the standard range, it can be determined that at the both ends of the block, a part having oxygen concentration being out of a standard range is included. Accordingly, another sample is further sliced from the end of the block and oxygen concentration in its plane is measured repeatedly. Then, if the oxygen concentration in its plane becomes in the standard range, it can be determined that oxygen concentration in the block becomes certainly in the standard range. This is why end faces in the ingot are at peak positions such as maximum and minimum and therefore if the next sample is admitted, the ingot in the internal side from it can be proved in the standard. Therefore, by slicing this block into silicon wafers, silicon wafers having oxygen concentration being in the standard range over the entire plane can be certainly produced.

If an ingot is cut into blocks at a cut position at which oxygen concentrations at both ends of each of the blocks are maximum and minimum as described above and further oxygen concentration in a plane at each of the both ends of each of the blocks is measured after the cutting, even in the case that a measurement value measured in the ingot state according to an oxygen concentration measurement apparatus is in the standard range and however the center or the periphery thereof is actually out of the standard, it can be certainly detected and the overlooking can be prevented. Therefore, with respect to oxygen concentration measurement, extremely high reliability can be obtained and moreover improvement of device yield and improvement of the production recipe can be effectively accomplished.

EXAMPLES

Hereinafter, Examples according to the present invention will be explained.

<Growth of an Ingot>

Figure 2:
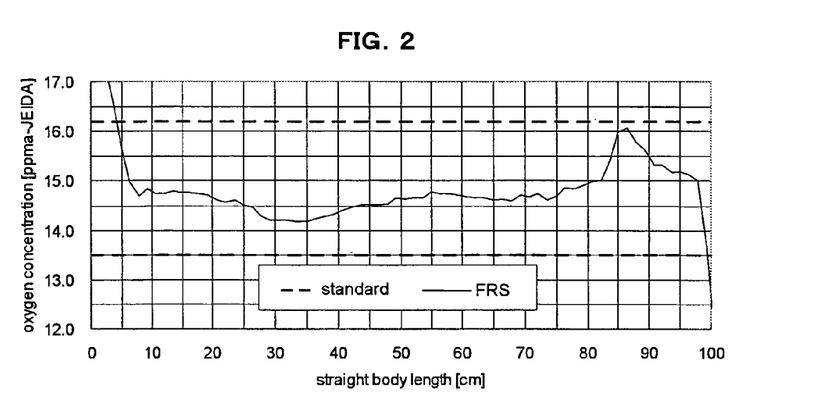
FIG. 2 is a view showing an oxygen concentration distribution in the growth axis direction of an ingot.

A 300-kg silicon polycrystal was charged in a quartz crucible having a bore diameter of 32 inches and a silicon single crystal ingot having a diameter of 300 mm and a straight body length of 100 cm was produced. An oxygen concentration standard was set to 13.5-16.2 ppma (JEIDA). After the grown ingot was cylindrically ground, oxygen concentration was measured by 20-mm intervals in the ingot state according to a QS-FRS system (manufactured by Accent. Co., Ltd.). FIG. 2 shows an oxygen concentration distribution in the growth axis direction of the ingot, and as the measurement results, oxygen concentration in 5 cm-98 cm of the straight body satisfied the standard.

<Cutting the Ingot into Blocks>

Figure 3:
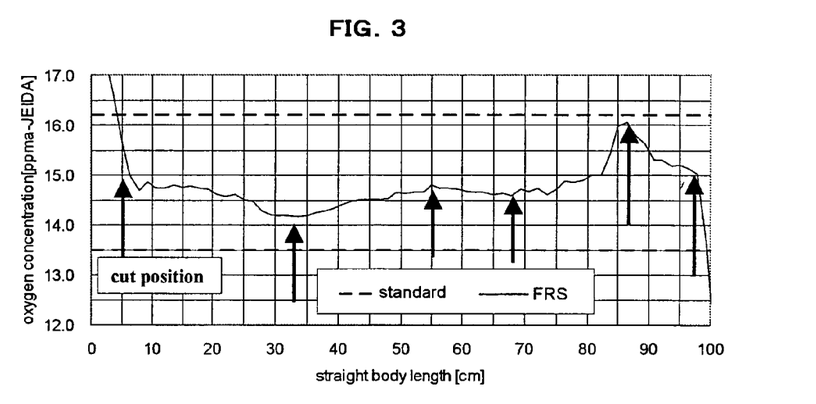
FIG. 3 is a view showing a cut position in an ingot.

The oxygen concentration distribution data was taken in a database of a system for determining a cut position of an ingot according to the present invention, and a cut position was automatically determined in a range of a length for being possible to be put in a slicing apparatus so that the oxygen concentrations at the both ends are maximum and minimum. FIG. 3 shows a determined cut position and the ingot was divided into five and the determination was performed so that oxygen concentrations at both ends of each of the blocks are maximum and minimum (5 cm from a crystal head and 2 cm from a crystal tail are out of the standard and therefore excluded).

<Oxygen Concentration Measurement at Both Ends of Each of Blocks>

An ingot was cut at a cut position determined as described above and split into five blocks. And, slab samples were sliced from the both ends of each of the blocks and oxygen concentrations were measured at the center and at positions of 10 mm from the periphery in each of the samples measured according to FTIR. The measurement values of each oxygen concentration at the center and the periphery in the samples measured according to FTIR were shown in FIG. 4.

Figure 4:
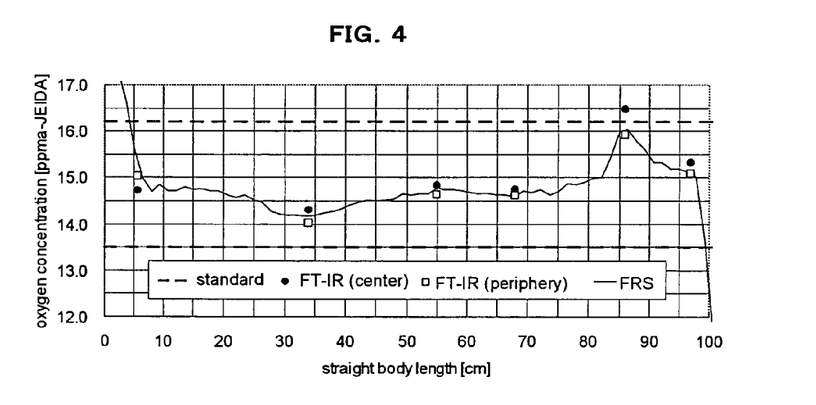
FIG. 4 is a view in which measurement results of the oxygen concentration in the center and the periphery in each of slab samples are added.

As shown in FIG. 4, it was confirmed that the oxygen concentration in a plane of each of the slab samples measured according to FTIR became a value which was relatively close to the result measured in the ingot state according to the QS-FRS system and however there was tendency the value was higher in the center and lower in the periphery. And, it was confirmed that the oxygen concentration at the center of a part corresponding to the 86-cm length of a straight body was over the upper limitation of the standard (16.2 ppma).

Figure 5:
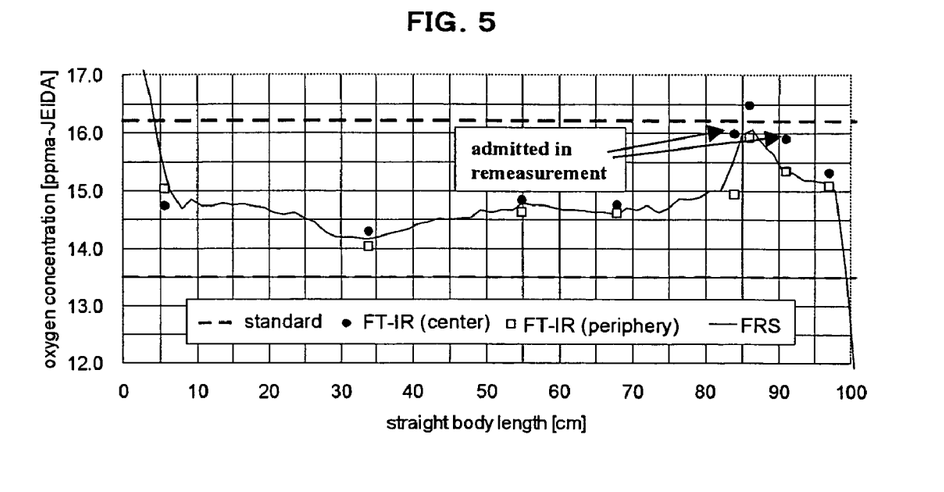
FIG. 5 is a view in which measurement results of the oxygen concentration in slab samples by remeasurement are added.

Accordingly, the vicinity of the cut position at which the oxygen concentration was out of the standard, namely, the tail side of the fourth block and the top side of the fifth block were cut in and slab samples were further sliced from the ends of each of the cut-in blocks and oxygen concentration was re-measured according to FTIR. As a result, as shown in FIG. 5, both of the center and the periphery in each of the samples satisfied the oxygen concentration standard.

Accordingly, the five ingots were sent to the slicing step and semiconductor silicon wafers were produced. And, with respect to all of the obtained wafers, oxygen concentration was measured and therefore all of the wafers were in the standard.

In addition, the present invention is not limited to the embodiments described above. The above-described embodiments are merely examples, and those having the substantially same constitution as that described in the appended claims and providing the similar working effects are included in the scope of the present invention.

For example, the present invention is not limited to be applied to a silicon single crystal ingot but can be applied to the case of producing wafers from another semiconductor ingot.

The invention claimed is:

1. A method for producing semiconductor wafers from a semiconductor ingot, wherein:
   an oxygen concentration distribution in the growth axis direction is measured in the ingot state,
   a position at which the oxygen concentration is maximum or minimum, in a range of a predetermined length of the semiconductor ingot, is determined as a cut position according to the measurement results,
   the ingot is cut in a perpendicular direction to the growth axis at the cut position into blocks each having the oxygen concentration being maximum at one end thereof and the oxygen concentration being minimum at the other end thereof,
   each of the blocks is sliced, and
   thereby semiconductor wafers are produced.

2. The method for producing semiconductor wafers according to claim 1, wherein:
   in the determination of the cut position, the semiconductor ingot is divided into blocks within a range of a preliminarily set length, the position to be cut is adjusted so that the oxygen concentrations of each of the blocks are maximum at one end and minimum at the other end, and when it is confirmed that the oxygen concentrations of each of all the blocks are maximum at one end and minimum at the other end, the position is determined as the cut position.

3. The method for producing semiconductor wafers according to claim 1, wherein:
   in the determination of a cut position, the cut position is determined so that the oxygen concentrations are in a standard range and maximum at one end and minimum at the other end of each of the blocks.

4. The method for producing semiconductor wafers according to claim 1, wherein:
   samples are sliced from both ends of each of the blocks obtained by cutting the semiconductor ingot, oxygen concentration in a plane of each of the samples is measured, and if the oxygen concentration in a plane is in a standard range, the block is sliced, and thereby semiconductor wafers are produced.

5. The method for producing semiconductor wafers according to claim 2, wherein:

samples are sliced from both ends of each of the blocks obtained by cutting the semiconductor ingot, oxygen concentration in a plane of each of the samples is measured, and if the oxygen concentration in a plane is in a standard range, the block is sliced, and thereby semiconductor wafers are produced.

6. The method for producing semiconductor wafers according to claim 3, wherein:

samples are sliced from both ends of each of the blocks obtained by cutting the semiconductor ingot, oxygen concentration in a plane of each of the samples is measured, and if the oxygen concentration in a plane is in a standard range, the block is sliced, and thereby semiconductor wafers are produced.

7. The method for producing semiconductor wafers according to claim 1, wherein:

samples are sliced from both ends of each of the blocks obtained by cutting the semiconductor ingot, oxygen concentration in a plane of each of the samples is measured, and if the oxygen concentration in a plane is out of a standard range, another sample is further sliced from the end of the block and oxygen concentration in its plane is measured repeatedly, and then if the oxygen concentration in its plane becomes in the standard range, the block is sliced, and thereby semiconductor wafers are produced.

8. The method for producing semiconductor wafers according to claim 2, wherein:

samples are sliced from both ends of each of the blocks obtained by cutting the semiconductor ingot, oxygen concentration in a plane of each of the samples is measured, and if the oxygen concentration in a plane is out of a standard range, another sample is further sliced from the end of the block and oxygen concentration in its plane is measured repeatedly, and then if the oxygen concentration in its plane becomes in the standard range, the block is sliced, and thereby semiconductor wafers are produced.

9. The method for producing semiconductor wafers according to claim 3, wherein:

samples are sliced from both ends of each of the blocks obtained by cutting the semiconductor ingot, oxygen concentration in a plane of each of the samples is measured, and if the oxygen concentration in a plane is out of a standard range, another sample is further sliced from the end of the block and oxygen concentration in its plane is measured repeatedly, and then if the oxygen concentration in its plane becomes in the standard range, the block is sliced, and thereby semiconductor wafers are produced.

10. The method for producing semiconductor wafers according to claim 1, wherein as the semiconductor ingot, a silicon single crystal ingot having a diameter 150 mm or more is used.

11. The method for producing semiconductor wafers according to claim 2, wherein as the semiconductor ingot, a silicon single crystal ingot having a diameter 150 mm or more is used.

12. The method for producing semiconductor wafers according to claim 3, wherein as the semiconductor ingot, a silicon single crystal ingot having a diameter 150 mm or more is used.

13. The method for producing semiconductor wafers according to claim 4, wherein as the semiconductor ingot, a silicon single crystal ingot having a diameter 150 mm or more is used.

14. The method for producing semiconductor wafers according to claim 5, wherein as the semiconductor ingot, a silicon single crystal ingot having a diameter 150 mm or more is used.

15. The method for producing semiconductor wafers according to claim 6, wherein as the semiconductor ingot, a silicon single crystal ingot having a diameter 150 mm or more is used.

16. The method for producing semiconductor wafers according to claim 7, wherein as the semiconductor ingot, a silicon single crystal ingot having a diameter 150 mm or more is used.

17. The method for producing semiconductor wafers according to claim 8, wherein as the semiconductor ingot, a silicon single crystal ingot having a diameter 150 mm or more is used.

18. The method for producing semiconductor wafers according to claim 9, wherein as the semiconductor ingot, a silicon single crystal ingot having a diameter 150 mm or more is used.

* * * * *